(12) United States Patent
Liu et al.

(10) Patent No.: US 10,421,668 B2
(45) Date of Patent: Sep. 24, 2019

(54) METHOD FOR PREPARING TUNGSTEN SULFIDE THIN FILM

(71) Applicant: SHENZHEN UNIVERSITY, Shenzhen, Guangdong (CN)

(72) Inventors: Xinke Liu, Guangdong (CN); Jiazhu He, Guangdong (CN); Qiang Liu, Guangdong (CN); Youming Lv, Guangdong (CN); Wenjie Yu, Guangdong (CN); Shun Han, Guangdong (CN); Peijiang Cao, Guangdong (CN); Wenjun Liu, Guangdong (CN); Yuxiang Zeng, Guangdong (CN); Fang Jia, Guangdong (CN); Deliang Zhu, Guangdong (CN)

(73) Assignee: SHENZHEN UNIVERSITY, Shenzhen (CN)

(*) Notice: Subject to any disclaimer, the term of this patent is extended or adjusted under 35 U.S.C. 154(b) by 288 days.

(21) Appl. No.: 15/605,908

(22) Filed: May 25, 2017

(65) Prior Publication Data

US 2017/0275180 A1     Sep. 28, 2017

Related U.S. Application Data

(63) Continuation of application No. PCT/CN2016/077550, filed on Mar. 28, 2016.

(30) Foreign Application Priority Data

Mar. 28, 2016  (CN) .......................... 2016 1 0182002

(51) Int. Cl.
 *C23C 16/30* (2006.01)
 *C01G 41/00* (2006.01)
 (Continued)

(52) U.S. Cl.
 CPC .......... *C01G 41/00* (2013.01); *C23C 16/0227* (2013.01); *C23C 16/305* (2013.01);
 (Continued)

(58) Field of Classification Search
 CPC .. C23C 16/305; C23C 16/30; C23C 16/45525
 See application file for complete search history.

(56) References Cited

U.S. PATENT DOCUMENTS

2002/0150683 A1* 10/2002 Troian ................ B01F 13/0071
                                                    137/828
2011/0011832 A1*  1/2011 Ishizaki ........... B29D 11/00865
                                                    216/26
(Continued)

OTHER PUBLICATIONS

Song, Jeong-Gyu, et al., "Layer-controlled, wafer-scale, and conformal synthesis of Tungsten Disulfide Nanosheets Using Atomic Layer Deposition". ACS Nano, vol. 7, No. 12, 11333-11340, 2013.*
(Continued)

*Primary Examiner* — Bret P Chen

(57) ABSTRACT

A method for preparing a tungsten sulfide thin film is provided. The method includes the steps of: applying a one-atom-thick W layer on a silicon substrate; applying a one-atom-thick S layer on the W layer; and applying another one-atom-thick W layer on the S layer, to obtain a thin film that is a single-layer thin film having a W—S—W layered structure.

7 Claims, 3 Drawing Sheets

(51) Int. Cl.
   *H01L 21/02* (2006.01)
   *C23C 16/02* (2006.01)
   *C23C 16/455* (2006.01)
   *B82Y 40/00* (2011.01)
   *B82Y 30/00* (2011.01)

(52) U.S. Cl.
   CPC .. *C23C 16/45525* (2013.01); *C23C 16/45529* (2013.01); *H01L 21/0262* (2013.01); *H01L 21/02381* (2013.01); *H01L 21/02488* (2013.01); *H01L 21/02568* (2013.01); *H01L 21/02658* (2013.01); *B82Y 30/00* (2013.01); *B82Y 40/00* (2013.01); *C01P 2002/82* (2013.01); *C01P 2004/02* (2013.01); *Y10S 977/755* (2013.01); *Y10S 977/891* (2013.01); *Y10S 977/932* (2013.01)

(56) References Cited

U.S. PATENT DOCUMENTS

| | | | | |
|---|---|---|---|---|
| 2011/0236575 | A1* | 9/2011 | King | C04B 41/009 427/214 |
| 2011/0260576 | A1* | 10/2011 | Masaki | H04R 19/005 310/300 |
| 2013/0267408 | A1* | 10/2013 | Choi | C08F 10/00 502/152 |
| 2014/0011347 | A1* | 1/2014 | Yerushalmi | H01L 21/2225 438/546 |
| 2015/0184297 | A1* | 7/2015 | Kim | C23C 16/45544 427/255.31 |
| 2015/0241386 | A1* | 8/2015 | Kim | H05K 3/32 73/31.06 |

OTHER PUBLICATIONS

Groven, Benjamin, et al., "Two-Dimensional Crystal Grain Size Tuning in WS2 Atomic Layer Deposition: An Insight in the Nucleation Mechanism". Chem. Mater. 2018, 30, 7648-7663.*

Scharf, T.W., et al., "Atomic layer deposition of tungsten disulphide solid lubricant thin films". J. Mater. Res., vol. 19, No. 12, Dec. 2004, pp. 3443-3446.*

Mattinen, Miika, et al., "Crystalline tungsten sulfide thin films by atomic layer deposition and mild annealing". J. Vac. Sci. Technol. A 37(2), Mar./Apr. 2019, 020921-1 to 020921-9.*

YongFeng, Sun, et al., "A direct atomic layer deposition method for growth of ultra-thin lubricant tungsten disulfide films". Science China Technological Sciences, Jan. 2017, vol. 60, No. 1: 51-57.*

Hao, W., et al., "Atomic layer deposition of stable 2D materials". 2D Mater. 6 (2019) 012001, pp. 1-45.*

Lee, Yi-Hsien, et al., "Synthesis of Large-Area MoS2 Atomic Layers with Chemical Vapor Deposition". pp. 1-9. No date or citation available.*

* cited by examiner

METHOD FOR PREPARING TUNGSTEN SULFIDE THIN FILM

CROSS REFERENCE TO RELATED APPLICATIONS

This application is a continuation application of PCT Application No. PCT/CN2016/077550 filed on Mar. 28, 2016, which claims priority to Chinese Patent Application No. 201610182002.6, filed on Mar. 28, 2016, the entire contents of which are incorporated herein by reference.

TECHNICAL FIELD

The present invention relates to the technical field of inorganic nanofilm materials, and particularly to a tungsten sulfide thin film and a preparation method therefor.

BACKGROUND

The tungsten sulfide ($WS_2$) thin film is similar to the molybdenum sulfide thin film in structure and performances, and the tungsten sulfide thin film also has an adjustable band gap. The band gap of bulk $WS_2$ crystal is 1.3 eV, and the electronic transition mode is indirect transition. When having a single-layer thickness, the band gap of $WS_2$ can be up to 2.1 eV, and the electronic transition mode becomes direct transition. Therefore, the $WS_2$ thin film is a two-dimensional nano-material having important application prospect in the fields of electronic devices, especially in the electrical, optical, and semiconductor fields, because of its unique structure, excellent physical properties and adjustable band gap. Due to the special optical and electrical performances, the tungsten disulfide thin film has found very wide use in the field of optoelectronics, and is widely used in the production of field effect transistors, sensors, light-emitting diodes, high-capacity capacitor storage and lithium battery electrodes. Due to the special crystal structure, the tungsten sulfide ($WS_2$) thin film is also widely used in catalysis, friction reduction and other fields. Although $WS_2$ thin film has great potential for application, the single-layer $WS_2$ thin film grown in the prior art has a very small product area, a relatively poor density, and more sulfur vacancies, resulting in poor performances of the thin film prepared.

SUMMARY

To solve the technical problems above, the present invention provides a method for preparing a tungsten sulfide thin film, so as to overcome the disadvantages of the method in the prior art for preparing tungsten sulfide thin films by obtaining a desirable method for preparing tungsten sulfide thin films with large area and high quality.

The present invention is accomplished as follows. A method for preparing a tungsten sulfide thin film comprises:

Step 1: applying a one-atom-thick W layer on a silicon substrate;

Step 2: applying a one-atom-thick S layer on the W layer; and

Step 3: applying another one-atom-thick W layer on the S layer, to obtain a thin film wherein the thin film is a single-layer thin film having a W—S—W layered structure.

Further, the silicon substrate is covered with a thermally grown $SiO_2$ layer.

Further, the silicon substrate is washed before use through a process comprising sequentially: ultrasonically soaking the silicon substrate in acetone, and then washing with deionized water, a mixture of a hydrogen peroxide solution with concentrated sulfuric acid, and deionized water.

Further, in the ultrasonically soaking in acetone, the weight ratio of acetone to the silicon substrate is 20:1.

Further, in the ultrasonically soaking in acetone, the frequency is 28 kHz, the power is 150 W; and the washing time is 10-25 min.

Further, the process of washing with a mixture of a hydrogen peroxide solution with concentrated sulfuric acid comprises soaking the silicon substrate in the mixture for 2-3 hrs.

Further, the mixture of the hydrogen peroxide solution with concentrated sulfuric acid is formulated through a process comprising adding a 30% hydrogen peroxide solution to 98% concentrated sulfuric acid, and stirring, to obtain the mixture after the solution is completely cooled, wherein the volume ratio of the hydrogen peroxide solution to concentrated sulfuric acid is 1:3.

Further, the technology for applying an atomic layer of W in Steps 1 and 3 comprises one of atomic layer deposition (ALD), pulsed laser deposition (PLD) and magnetron sputtering.

Further, the process used in Step 2 is chemical vapor deposition (CVD).

The present invention further provides a tungsten sulfide thin film prepared through the method above.

Further, the thin film is monolithic, and has an area of 1-3 square centimeters.

Compared with the prior art, the present invention has the following beneficial effects. In the present invention, an atomic layer of W is applied on the silicon substrate by ALD, then an atomic layer of S is grown on the atomic layer of W by CVD, and then an atomic layer of W is further applied by ALD. In this way, a single-layer thin film having a W—S—W layered structure is grown. Through the method according to the present invention, large-area preparation of the W—S—W thin film is realized, and the prepared W—S—W thin film has high density and less sulfur vacancies, such that the quality of the W—S—W thin film is considerably improved, thereby greatly improving the electrical performance of the W—S—W thin film.

BRIEF DESCRIPTION OF DRAWINGS

FIG. 3(a) and FIG. 3(b) show the results of optical microscopy and Raman spectroscopy, wherein FIG. 3(a) shows the Raman test result, and FIG. 3(b) shows the PL test result.

DETAILED DESCRIPTION

Figure 1:
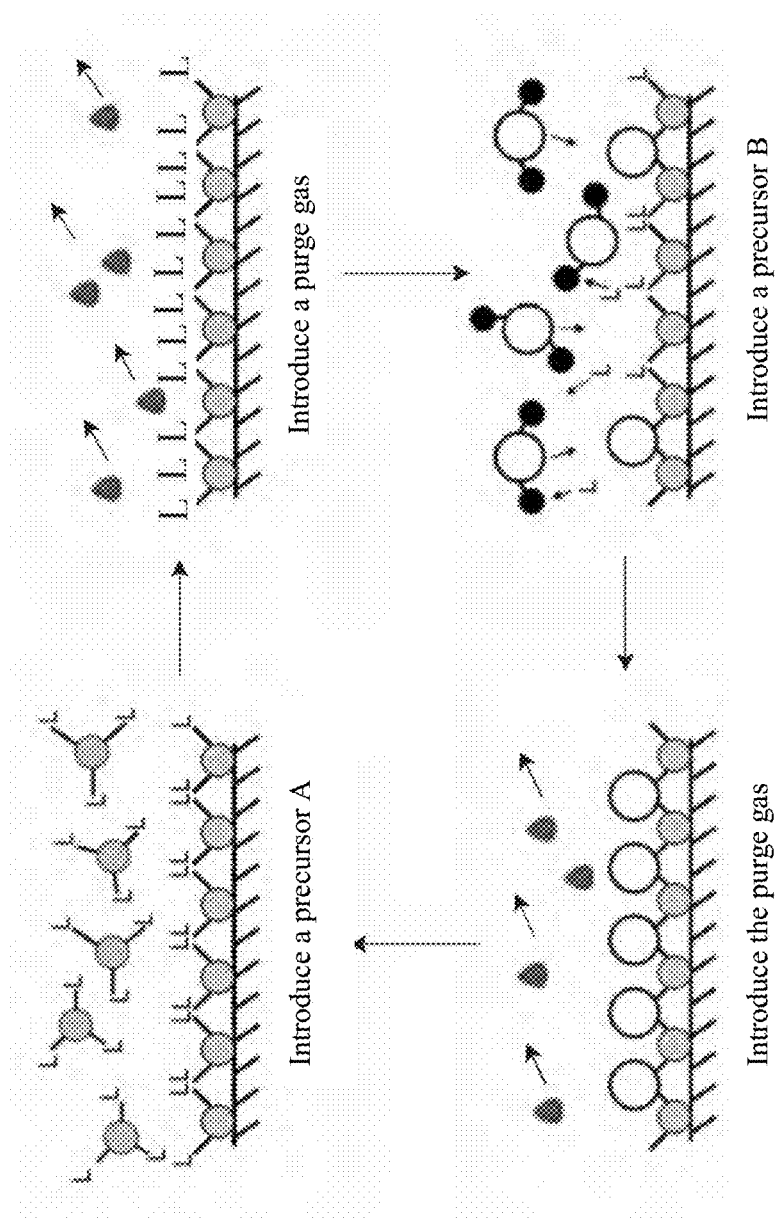
FIG. 1 is a schematic diagram showing a basic ALD reaction cycle in the present invention.

To make the objectives, technical solutions and advantages of the present invention clearer, the present invention will be described in further detail below with reference to the accompanying drawings and embodiments. It should be understood that specific embodiments described herein are merely illustrative and not intended to limit the present invention.

Chemical vapor deposition (CVD) refers to a process in which gaseous reactants or a vapor of liquid reactants containing the elements constituting a thin film and other gases required for the reaction are introduced into a reaction chamber and chemically reacted on a surface of a substrate, to produce a thin film.

Atomic layer deposition (ALD) is a method in which a substance can be applied on a surface of a substrate layer by layer in the form of a one-atom-thick film. The basic process of ALD comprises impulsively introducing the gaseous precursors alternately into a reaction chamber, and a surface chemical adsorption reaction occurs on a substrate for deposition, to form a thin film. The ALD is similar to the conventional chemical deposition.

Pulsed laser deposition (PLD) is a means by which a precipitate or a thin film is obtained by bombarding an object with laser, and then precipitating the material bombard out on a different substrate.

Magnetron sputtering is a method in which during the process of the electrons that are accelerated under the action of an electric field flying to a substrate, the electrons collide with argon atoms, and a large number of argon ions and electrons are ionized; the electrons fly to the substrate, and the argon ions are accelerated under the action of the electric field and bombard a target; and a large number of target atoms are thus sputtered out, and the neutral target atoms (or molecules) are deposited on the substrate to form a film.

According to the technical solution of the present invention, the tungsten sulfide thin film is prepared as follows.

First, a $SiO_2$ substrate is prepared, and acetone, deionized water, and a mixture of a hydrogen peroxide solution with concentrated sulfuric acid are also prepared for washing the $SiO_2$ substrate. Specifically, the mixture of the hydrogen peroxide solution with concentrated sulfuric acid is formulated through a process comprising adding a 30% hydrogen peroxide solution to 98% concentrated sulfuric acid, and stirring, to obtain the mixture after the solution is completely cooled, wherein the volume ratio of the hydrogen peroxide solution to concentrated sulfuric acid is 1:3.

The $SiO_2$ substrate is sequentially ultrasonically soaked in acetone, and then washed with deionized water, the mixture of the hydrogen peroxide solution with concentrated sulfuric acid, and deionized water. Particularly, the $SiO_2$ substrate is initially ultrasonically washed for 20 min in acetone, wherein the weight ratio of acetone to the silicon substrate is 20:1; and in the ultrasonically soaking the $SiO_2$ substrate in acetone, the frequency is 28 kHz, and the power is 150 W. Then, the $SiO_2$ substrate is washed with deionized water, soaked for 2-3 hrs in the mixture of the hydrogen peroxide solution with concentrated sulfuric acid, and then washed with deionized water.

A specific process for preparing a tungsten sulfide thin film is as follows.

Step 1: An atomic layer of W is applied onto the silicon substrate by ALD.

In the process, ALD is used. ALD is not a continuous process, but consists of a series of half-reactions. FIG. 1 is a schematic diagram showing a basic ALD reaction cycle. Each cycle generally comprises the following four steps. First, a pulse of a precursor vapor A is introduced into a reaction chamber, and chemically adsorbed onto an exposed surface of a substrate. Then, a purge gas (generally an inert gas, for example, high-purity nitrogen or argon) is introduced, to entrain the unadsorbed precursor vapor A and the reaction by-products out of the reaction chamber. Next, a pulse of a precursor vapor B is introduced, and undergoes surface chemical reaction with the adsorbed A. Finally, the purge gas is introduced again, to entrain excessive precursor vapor B and the reaction by-products out of the reaction chamber. Theoretically, a single-atom-thick layer is deposited on the surface of the substrate once one cycle is performed. In FIG. 1, L denotes a precursor ligand. Specifically, as shown in FIG. 1, the vapors A and B are reactive gases during the ALD growth process. Correspondingly, the vapor A in the process for growing the atomic layer of tungsten is $WF_6$, and the vapor B is $Si_2H_6$.

In the process for growing the atomic layer of tungsten, the reaction mechanism is that the Si—F bond is extremely stable, and a typical exothermic reaction takes place. The entire chemical reaction is $WF_6+Si_2H_6 \rightarrow W+SiF_3H+2H_2$. The molar enthalpy change $\Delta H$ of reaction during the chemical process is −181 kcal/mol. The reaction of tungsten hexafluoride and disilane affords a very smooth and pure tungsten film, the growth rate at low temperatures is approximately ideally one molecular layer per cycle (0.25 nm/cycle), and the film thickness is proportional to the number of cycles. These suggest the complete surface reaction between the two precursors, and confirm the occurrence of two saturated self-limiting half-reactions, that is,

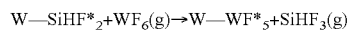

Total reaction: $WF_6(g)+Si_2H_6(g) \rightarrow W+SiHF_3+2H_2(g)$

In the present invention, the W thin film is prepared by using the BENEQ TFS 200-124 Model ALD Equipment, manufactured by Beneq, Finland. The process is as follows:

(1) Open the N2 valve, set the pressure of the dynamic gas to 0.5 Mpa, and set the pressure of the carrier gas to 0.14 Mpa;

(2) Turn on the power control box;

(3) Open the mechanical pump;

(4) Run the control software;

(5) Set the temperature to 60° C.;

(6) When the temperature in the reaction chamber reaches about 60° C., press the button vent to purge the chamber, then open the lid, place a silicon wafer therein, and then close;

(7) Evacuate until the pressure in the chamber is stable;

(8) Set the reaction temperature to 300° C.;

(9) Set the pressure of the precursor gases:

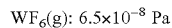

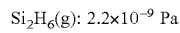

(10) Set the formulation in the reaction to grow a W thin film of 0.25 nm;

(11) Remove the sample after reaction, and close the equipment.

Step 2: An atomic layer of S is applied onto the atomic layer of W.

In this process, CVD is employed. The experimental conditions in this process of the present invention include the following. The sulfur powder (0.1 g) is used as a sulfur source, the high-purity argon is used as a carrier gas (flow rate 15 sccm), and the temperature is 300° C. and maintained 2 min, for preparing a tungsten sulfide thin film on the silica wafer having the atomic layer of W deposited thereon.

Step 3. Another atomic layer of W is applied onto the atomic layer of S, to obtain a W—S—W thin film.

In this process, ALD is employed. The specific operation process and principle are the same as those in Step 1.

Figure 2:
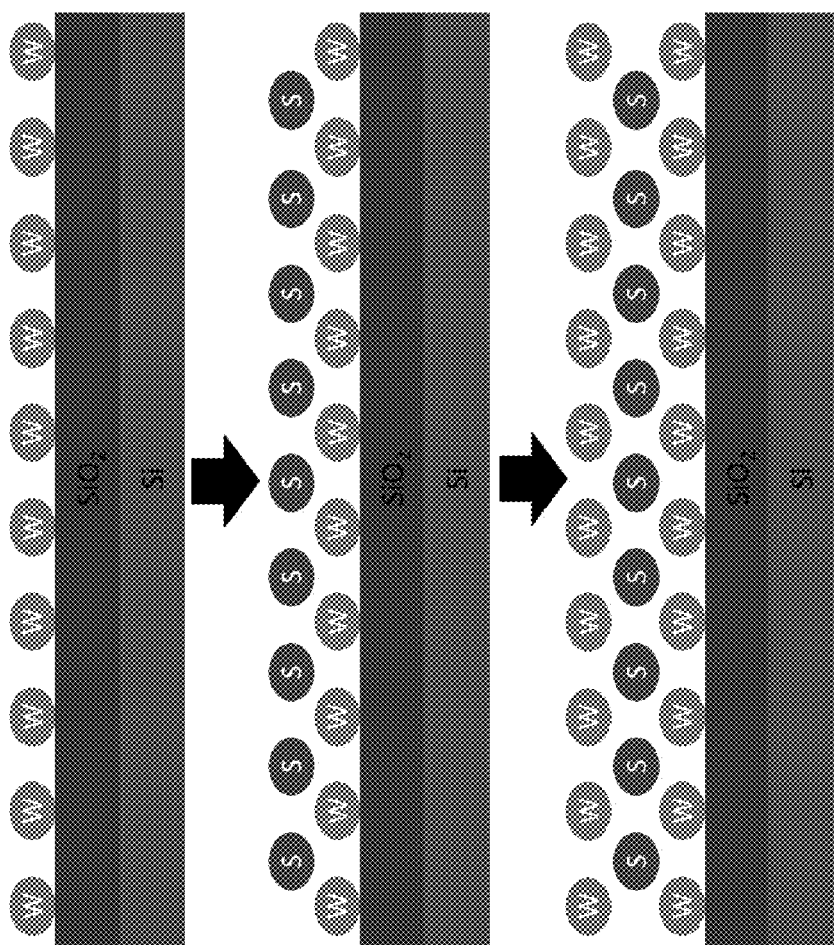
FIG. 2 is a schematic flow chart of a technical solution of the present invention.

Particularly, the thin film growth process is as shown in FIG. 2. Through the method according to the present invention, large-area preparation of the W—S—W thin film is realized, and the prepared W—S—W thin film is a single-layer thin film having W—S—W layered structure, high density and less sulfur vacancies such that the quality of the W—S—W thin film is improved and the defects of the W—S—W thin film material are reduced, thereby greatly improving the electrical performance of the W—S—W thin film.

The product obtained under the process conditions proposed in the present invention is a W—S—W thin film. Raman spectroscopy and photoluminescence (PL) mapping are important means of studying the tungsten sulfide thin film. The W—S—W thin film is characterized by laser Raman spectroscopy. In the Raman spectrum, two Raman active vibration peaks are observable, which are of the $E^1_{2g}$ and $A_{1g}$ vibration modes of tungsten disulfide, and correspond to a Raman shift of 355.6 $cm^{-1}$ and 418.3 $cm^{-1}$ respectively. As confirmed by experiments in literatures, the $E^1_{2g}$ vibration mode of the single-layer W—S—W has a Raman shift of 356 $cm^{-1}$, and the $A_{1g}$ vibration mode has a Raman shift of 417.5 $cm^{-1}$. With increasing number of layers, the $E^1_{2g}$ vibration is softened (red shifted, with the frequency being decreased), and the $A_{1g}$ vibration is stiffened (blue shifted, with the frequency being increased). The $E^1_{2g}$ and $A_{1g}$ vibration modes of the bulk tungsten disulfide material have a Raman shift of 355.5 $cm^{-1}$ and 420.5 $cm^{-1}$ respectively. Compared with the positions of characteristic peaks observed for the $E^1_{2g}$ and $A_{1g}$ vibration modes of different layers of tungsten disulfide in the literatures, the Raman spectrum of the sample determined is in agreement with that of the single-layer W—S—W.

Figure 3:
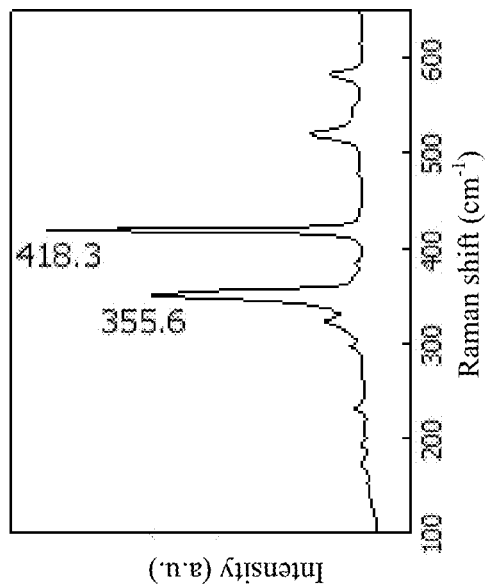
Figure 3:
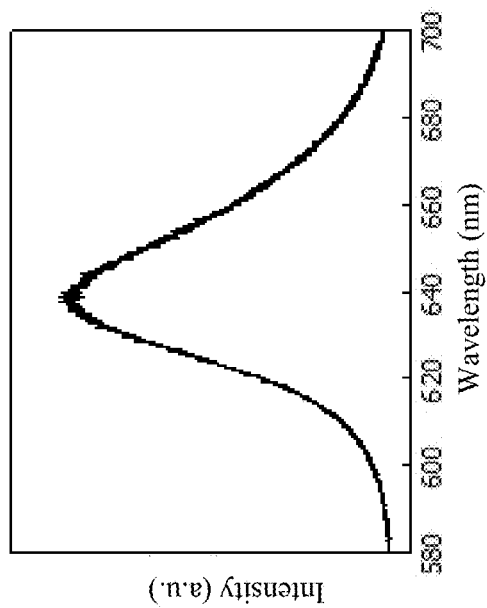

PL mapping is also performed on the sample thin film by using a Raman spectrometer. The shape and thickness of the thin film are characterized since a crystalline thin film with a different thickness has different luminous properties. When having a single layer thickness, the band gap of W—S—W can be up to 2.1 eV. The thin film prepared in the present invention is experimentally confirmed to be a single-layer W—S—W. FIG. 3(a) and FIG. 3(b) shows the results of optical microscopy and Raman spectroscopy, wherein FIG. 3(a) shows the Raman test result, and FIG. 3(b) shows the PL test result.

It can be seen from the Raman and PL spectra that the product obtained under the process conditions proposed in the present invention is indeed a single-layer W—S—W thin film and is of excellent quality. Moreover, in addition to the ALD used to grow the atomic layer of W, a series of other methods, such as pulsed laser deposition (PLD) and magnetron sputtering, may also be used to grow the atomic layer of W in the present invention.

It can be known from measurements that the W—S—W thin film prepared in the present invention is a continuous monolithic thin film with an area of 1-3 square centimeters. In the present invention, large-area preparation of the W—S—W thin film is realized, and the quality of the prepared W—S—W thin film is considerably improved, thereby greatly improving the electrical performance of the W—S—W thin film.

In the application areas of tungsten sulfide thin films, when the two-dimensional transition metal dichalcogenides become from a bulk material to a single-layer material, the energy band gap of electrons changes accordingly from an indirect band gap to a direct band gap. At the same time, the optical performances change correspondingly, for example, a series of changes in optical performances such as photoluminescence, electroluminescence, and photovoltaic effects, are produced. The two-dimensional transition metal dichalcogenides have a photosensitivity that is several times higher than that of graphene, an electron mobility that is smaller than that of graphene due to the width of the forbidden band, and a response speed that is not so fast. Therefore, the two-dimensional transition metal dichalcogenides are useful in the fabrication of high-performance optical sensors, photoelectric detectors, and other devices. It is reported that flexible LED devices made with single-layer MoS2 thin films become available and have good optical properties, so the W—S—W thin film will also be used widely. Furthermore, similar to graphene, the transition metal dichalcogenides have certain characteristics in mechanical, optical, electrical, electrochemical and many other areas. The sheet-like structure similar to grapheme allows the transition metal dichalcogenides to have a large specific surface area, and more external stimulus can be received per unit area. As a semi-conductor material, the W—S—W transition metal dichalcogenide similar to grapheme imparts obvious switch response to the devices made therewith, and the high electron mobility resulting from the sheet-like structure thereof makes the response fast. The material has a high surface activity and thus can be easily modified with respect to its surface, to enhance the sensitivity and detection range. The series of advantages allow the W—S—W sensor to become a sensor that has high sensitivity and rapid response, and is applicable to a wide range of environments, thus having promising application prospects. The technical solution provided in the present invention provides a further broad application prospect for W—S—W thin films.

The technical solution of the present invention is further described with reference to specific examples.

Example 1

A $SiO_2$ substrate was prepared, and acetone, deionized water, and a mixture of a hydrogen peroxide solution with concentrated sulfuric acid were also prepared for washing the $SiO_2$ substrate. Specifically, the mixture of the hydrogen peroxide solution with concentrated sulfuric acid was formulated through a process comprising adding a 30% hydrogen peroxide solution to 98% concentrated sulfuric acid, and stirring, to obtain the mixture after the solution was completely cooled, wherein the volume ratio of the hydrogen peroxide solution to concentrated sulfuric acid was 1:3.

The $SiO_2$ substrate was sequentially ultrasonically soaked in acetone, and then washed with deionized water, the mixture of the hydrogen peroxide solution with concentrated sulfuric acid, and deionized water. Particularly, the $SiO_2$ substrate was initially ultrasonically washed for 20 min in acetone, wherein the weight ratio of acetone to the silicon substrate was 20:1; and in the ultrasonically soaking the $SiO_2$ substrate in acetone, the frequency was 28 kHz, and the power was 150 W. Then, the $SiO_2$ substrate was washed with deionized water, soaked for 3 hrs in the mixture of the hydrogen peroxide solution with concentrated sulfuric acid, and then washed with deionized water.

A specific process for preparing the tungsten sulfide thin film was as follows.

Step 1: An atomic layer of W was applied onto the silicon substrate by ALD.

Step 2: An atomic layer of S was applied onto the atomic layer of W.

The sulfur powder (0.1 g) was used as a sulfur source, the high-purity argon was used as a carrier gas (flow rate 15 sccm), and the temperature was 300° C. and maintained 2 min, for preparing a tungsten sulfide thin film on the silica wafer having the atomic layer of W deposited thereon.

Step 3: Another atomic layer of W was applied onto the atomic layer of S, to obtain a W—S—W thin film.

It can be known from measurements that the W—S—W thin film prepared in this example is a continuous monolithic thin film with an area of 2 square centimeters.

Example 2

A $SiO_2$ substrate was prepared, and acetone, deionized water, and a mixture of a hydrogen peroxide solution with concentrated sulfuric acid were also prepared for washing the $SiO_2$ substrate. Specifically, the mixture of the hydrogen peroxide solution with concentrated sulfuric acid was formulated through a process comprising adding a 30% hydrogen peroxide solution to 98% concentrated sulfuric acid, and stirring, to obtain the mixture after the solution was completely cooled, wherein the volume ratio of the hydrogen peroxide solution to concentrated sulfuric acid was 1:3.

The $SiO_2$ substrate was sequentially ultrasonically soaked in acetone, and then washed with deionized water, the mixture of the hydrogen peroxide solution with concentrated sulfuric acid, and deionized water. Particularly, the $SiO_2$ substrate was initially ultrasonically washed for 20 min in acetone, wherein the weight ratio of acetone to the silicon substrate was 20:1; and in the ultrasonically soaking the $SiO_2$ substrate in acetone, the frequency was 28 kHz, and the power was 150 W. Then, the $SiO_2$ substrate was washed with deionized water, soaked for 3 hrs in the mixture of the hydrogen peroxide solution with concentrated sulfuric acid, and then washed with deionized water.

A specific process for preparing the tungsten sulfide thin film was as follows.

Step 1: An atomic layer of W was applied onto the silicon substrate by ALD.

Step 2: An atomic layer of S was applied onto the atomic layer of W.

The sulfur powder (0.1 g) was used as a sulfur source, the high-purity argon was used as a carrier gas (flow rate 15 sccm), and the temperature was 300° C. and maintained 2 min, for preparing a tungsten sulfide thin film on the silica wafer having the atomic layer of W deposited thereon.

Step 3: Another atomic layer of W was applied onto the atomic layer of S, to obtain a W—S—W thin film.

It can be known from measurements that the W—S—W thin film prepared in this example is a continuous monolithic thin film with an area of 1 square centimeter.

The present invention has been described in detail with reference to preferred embodiments; however, the present invention is not limited thereto. Those skilled in the art will appreciate that various modifications, equivalent substitutions and improvements can be made thereto without departing from the spirit and scope of the present invention as set forth in the appended claims.

The invention claimed is:

1. A method for preparing a tungsten sulfide thin film, comprising:
    Step 1: applying a one-atom-thick W layer on a silicon substrate;
    Step 2: applying a one-atom-thick S layer on the W layer; and
    Step 3: applying another one-atom-thick W layer on the S layer, to obtain a thin film,
    wherein the thin film is a single-layer thin film having a W—S—W layered structural,
    the silicon substrate is washed before use through a process comprising sequentially: ultrasonically soaking the silicon substrate in acetone, and then washing with deionized water, a mixture of a hydrogen peroxide solution with concentrated sulfuric acid, and deionized water;
    wherein in the ultrasonically soaking the silicon substrate in acetone, the weight ratio of acetone to the silicon substrate is 20:1.

2. The preparation method according to claim 1, wherein the silicon substrate is covered with a thermally grown $SiO_2$ layer.

3. The preparation method according to claim 1, wherein in the ultrasonically soaking the silicon substrate in acetone, the frequency is 28 kHz, the power is 150 W and the washing time is 10-25 min.

4. The preparation method according to claim 1, wherein the process of washing with a mixture of a hydrogen peroxide solution with concentrated sulfuric acid comprises soaking the silicon substrate in the mixture for 2-3 hrs.

5. The preparation method according to claim 1, wherein the mixture of hydrogen peroxide solution and concentrated sulfuric acid is formulated through a process comprising adding a 30% hydrogen peroxide solution to 98% concentrated sulfuric acid, and stirring to obtain the mixture, wherein the volume ratio of the hydrogen peroxide solution to concentrated sulfuric acid is 1:3.

6. The preparation method according to claim 1, wherein applying the W layer in Steps 1 and 3 comprises one selected from the group consisting of atomic layer deposition (ALD), pulsed laser deposition (PLD) and magnetron sputtering.

7. The preparation method according to claim 1, wherein the Step 2 comprises a process of chemical vapor deposition (CVD).

* * * * *